(12) United States Patent
Loebig

(10) Patent No.: US 9,783,909 B2
(45) Date of Patent: Oct. 10, 2017

(54) ANISOTROPIC ETCHING OF METALLIC SUBSTRATES

(71) Applicant: Rolls-Royce North American Technologies, Inc., Indianapolis, IN (US)

(72) Inventor: James Carl Loebig, Greenwood, IN (US)

(73) Assignee: Rolls-Royce North American Technologies, Inc., Indianapolis, IN (US)

( * ) Notice: Subject to any disclaimer, the term of this patent is extended or adjusted under 35 U.S.C. 154(b) by 105 days.

(21) Appl. No.: 14/642,171

(22) Filed: Mar. 9, 2015

(65) Prior Publication Data

US 2016/0222518 A1  Aug. 4, 2016

Related U.S. Application Data

(60) Provisional application No. 61/951,662, filed on Mar. 12, 2014.

(51) Int. Cl.
  *C25F 3/14* (2006.01)
  *C25F 1/00* (2006.01)
  (Continued)

(52) U.S. Cl.
  CPC .............. *C25F 3/14* (2013.01); *C23C 14/22* (2013.01); *C23C 16/44* (2013.01);
  (Continued)

(58) Field of Classification Search
  CPC ................................ C25F 3/14; C23C 18/1637
  (Continued)

(56) References Cited

U.S. PATENT DOCUMENTS

| 4,108,660 A | 8/1978 | Gale et al. |
| 4,361,641 A | 11/1982 | Angus et al. |

(Continued)

FOREIGN PATENT DOCUMENTS

| KR | 1020080100807 | 11/2008 |
| WO | 2009094572 A1 | 7/2009 |

OTHER PUBLICATIONS

Office Action, and translation thereof, from counterpart Korean Patent Application No. 10-2015-0034448, dated Nov. 12, 2015, 11 pp.

(Continued)

*Primary Examiner* — Nicholas A Smith
(74) *Attorney, Agent, or Firm* — Shumaker & Sieffert, P.A.

(57) ABSTRACT

In some examples, a method includes forming a photoresist layer on a surface of a metallic substrate and developing the photoresist layer to define a pattern exposing a portion of the surface of the metallic substrate. The method also may include forming an electrically conductive layer on a surface of the photoresist layer and the exposed portions of the surface of the metallic substrate. The electrically conductive layer contacts the exposed portions of the surface of the metallic substrate. The method may further include submerging the substrate, the photoresist layer, and the electrically conductive layer in an electrolyte solution; and applying a voltage to between a cathode and an anode submerged in the electrolyte solution to anisotropically etch the metallic substrate where the electrically conductive layer contacts the exposed portions of the surface of the metallic substrate to form at least one feature in the metallic substrate.

11 Claims, 13 Drawing Sheets

(51) Int. Cl.
*C23C 18/16* (2006.01)
*C23C 14/22* (2006.01)
*C23C 16/44* (2006.01)
*C23F 1/00* (2006.01)
*G03F 7/30* (2006.01)

(52) U.S. Cl.
CPC ............ *C23C 18/1637* (2013.01); *C23F 1/00* (2013.01); *G03F 7/3007* (2013.01)

(58) Field of Classification Search
USPC ........................................................ 205/667
See application file for complete search history.

(56) References Cited

U.S. PATENT DOCUMENTS

| | | |
|---|---|---|
| 4,543,153 A | 9/1985 | Nelson |
| 4,765,865 A | 8/1988 | Gealer et al. |
| 5,346,597 A | 9/1994 | Lee et al. |
| 5,733,432 A | 3/1998 | Williams et al. |
| 6,402,931 B1 | 6/2002 | Zhou et al. |
| 6,762,134 B2 | 7/2004 | Bohn et al. |
| 6,843,929 B1 | 1/2005 | Farquhar et al. |
| 2004/0214431 A1* | 10/2004 | Shieh ...................... B23H 5/08 438/689 |
| 2010/0236940 A1 | 9/2010 | Kaajakari |
| 2011/0017608 A1 | 1/2011 | Taylor et al. |
| 2011/0244263 A1 | 10/2011 | Ku et al. |
| 2012/0171507 A1 | 7/2012 | Hung et al. |
| 2015/0096790 A1* | 4/2015 | Uzoh ................... H05K 1/0212 174/252 |

OTHER PUBLICATIONS

Response to Search Report dated Jul. 21, 2015, from counterpart European Application No. 15158123.8, filed Mar. 15, 2016, 18 pp.
Amended Claims, and translation thereof, from counterpart Korean Application No. 10-2015-0034448, filed Mar. 10, 2016, 14 pp.
Notice of Final Rejection from counterpart Korean Application No. 10-2015-0034448, dated Jun. 17, 2016, 9 pp.
Notice of Final Rejection from counterpart Korean Application No. 10-2015-0034448, dated Aug. 4, 2016, 8 pp.
Extended European Search Report from counterpart European Application No. 15158123.8, dated Jul. 21, 2015, 7 pp.

* cited by examiner

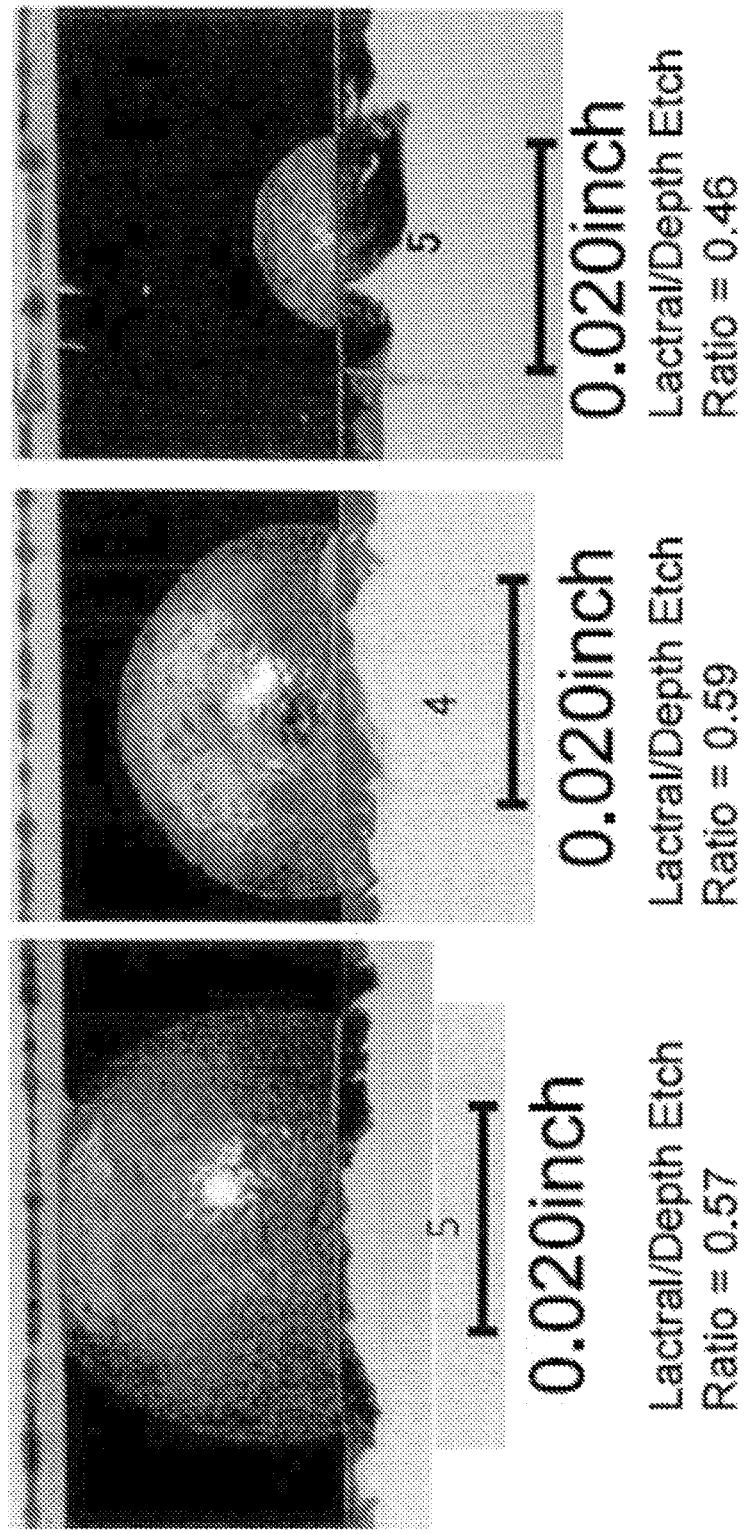

US 9,783,909 B2

ANISOTROPIC ETCHING OF METALLIC SUBSTRATES

This application claims the benefit of U.S. Provisional Patent Application No. 61/951,662, filed Mar. 12, 2014, and titled, "ANISOTROPIC ETCHING OF METALLIC SUBSTRATES," the entire content of which is incorporated herein by reference.

TECHNICAL FIELD

The disclosure relates to etching techniques for metallic substrates.

BACKGROUND

Through mask electrochemical etching (TMECE) or electrochemical machining, may be used to produce features, such as channels and holes, in metal components. TMECE isotropically etches the metal components, removing metal in all directions at an equal rate. Because of this, the features produced using TMECE have a width that is equal to two times the depth plus the width of the opening in the mask.

High speed micromachining also may be used to form features, such as channels and holes, in metal components. High speed machining may utilize machines that are positionable in at least three axes and small bits to form small features. High speed machining also may be time consuming, as each feature must be machined in the substrate, and making the process more parallel may be difficult.

SUMMARY

In general, the disclosure describes technique for anisotropically etching metallic substrates. The techniques described herein may include forming an electrically conductive layer on the photoresist used to define the feature geometry. When an electrical field is applied during the electrochemical etching process, the electrically conductive layer may shape the electric field through the apertures formed in the photoresist, which may result in anisotropic etching of the metallic substrate.

In some examples, because the etching is anisotropic, material from the metallic substrate may be removed at a greater rate in a direction normal to the surface of the metallic substrate than in the plane of the metallic substrate. This may result in the feature depth being greater than the feature width.

In one example, the disclosure describes a method including forming a photoresist layer on a surface of a metallic substrate and developing the photoresist layer to define a pattern exposing a portion of the surface of the metallic substrate. The method also may include forming an electrically conductive layer on a surface of the photoresist layer and the exposed portions of the surface of the metallic substrate. The electrically conductive layer contacts the exposed portions of the surface of the metallic substrate. The method may further include submerging the substrate, the photoresist layer, and the electrically conductive layer in an electrolyte solution; and applying a voltage to between a cathode and an anode submerged in the electrolyte solution to anisotropically etch the metallic substrate where the electrically conductive layer contacts the exposed portions of the surface of the metallic substrate to form at least one feature in the metallic substrate.

In another example, the disclosure describes an article including a metallic substrate and a photoresist layer on a surface of the metallic substrate. The photoresist layer defines a pattern exposing portions of the surface of the metallic substrate. The article also may include an electrically conductive layer on a surface of the photoresist layer and the exposed portions of the surface of the metallic substrate. The electrically conductive layer contacts the exposed portions of the surface of the metallic substrate.

In a further example, the disclosure describes an article including a metallic substrate and a photoresist layer on a surface of the metallic substrate. The photoresist layer defines a pattern exposing a portion of the surface of the metallic substrate. The article also may include an electrically conductive layer on a surface of the photoresist layer and a feature formed in the surface of the metallic substrate adjacent to the exposed portion of the surface of the metallic substrate. The feature may define a ratio of a maximum lateral etch distance to a maximum vertical etch distance that is less than 1.0.

The details of one or more examples are set forth in the accompanying drawings and the description below. Other features, objects, and advantages will be apparent from the description and drawings, and from the claims.

BRIEF DESCRIPTION OF DRAWINGS

FIGS. 14A-14C are example images of features formed in metallic substrates using anisotropic electrochemical etching.

DETAILED DESCRIPTION

Figure 1:
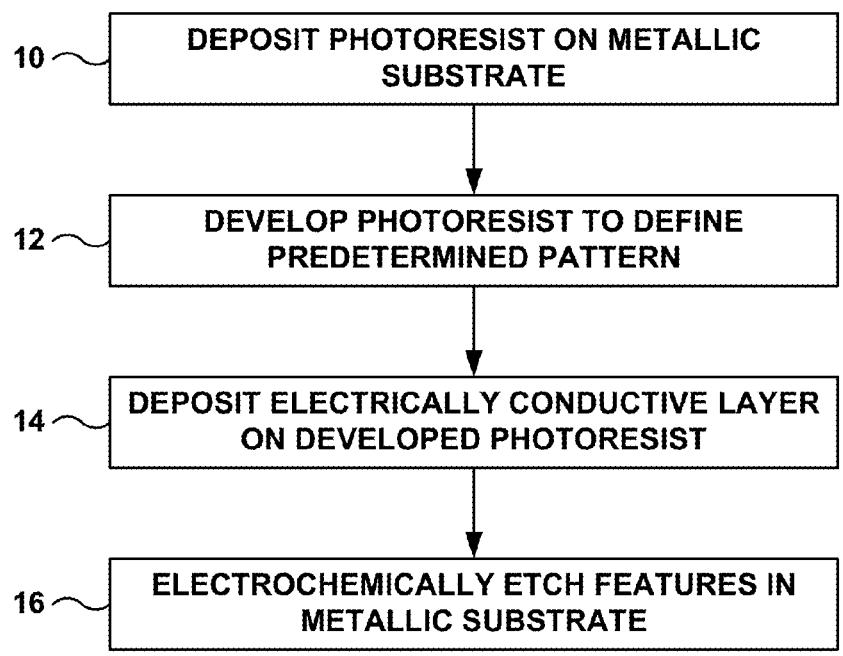
FIG. 1 is a flow diagram illustrating an example anisotropic electrochemical etching technique for etching features in a metallic substrate.

In general, the disclosure describes techniques for anisotropically etching metallic substrates using electrochemical etching. The techniques described herein may include forming an electrically conductive layer on the photoresist used to define the feature geometry. When an electrical field is applied during the electrochemical etching process, the electrically conductive layer may shape the electric field through the apertures formed in the photoresist, which may result in anisotropic etching of the metallic substrate.

In some examples, because the etching is anisotropic, material from the metallic substrate may be removed at a greater rate in a direction normal to the surface of the metallic substrate than in the plane of the metallic substrate. This may result in the feature depth being greater than the feature width. For example, the feature depth may be greater than two times the feature width. In some examples, this may allow a greater areal density of features to be formed in substrate. This may be advantageous for application where areal density affects performance, such as fluid channels for a heat exchanger.

Gas turbine engines may utilize high temperature alloys in hot sections of the engines. These high temperature alloys may be difficult to fabricate using conventional manufacturing methods, because they posses high toughness and heat resistance. Additionally, residual stress or damage from machining may negatively affect the properties of high temperature alloy, reducing component life.

In some examples, gas turbine engine combustor liners, vanes, and turbine blades are constructed with dual walls defining internal cavities, which allow cooling air to flow through the cavities to cool the walls. This cooling air is introduced into the cavities from outside the component (combustor liner, vanes, or blades), flows through the cavities, and exits through film cooling holes, flowing over external surfaces of the walls. The air stream cools the back side and external surfaces of the combustor liner walls, vane walls, and blade walls, which allows higher combustion temperatures and higher operating efficiencies. Techniques described herein may be used to form film cooling holes and other features for these cooling paths.

Techniques described herein also may be used to forming features for heat exchangers, fuel cells, and microchannel chemical reactors. For example, a heat exchanger may be used for intercooling of high pressure ratio gas turbine compressors. The heat exchanger may include a microchannel heat exchanger placed between two gas turbine engine compressor spools. Anisotropic electrochemical etching may facilitate economic formation of microchannel heat exchangers, due to the parallel formation of the plurality of microchannels and the high areal density of microchannels enabled by the techniques described herein. Anisotropic electrochemical etching also may allow construction of more efficient heat exchangers may be formed due to the higher areal density of microchannels. For example, in some implementations, anisotropic electrochemical etching may allow formation of microchannels with an areal density that is double of the areal density of microchannels formed using isotropic etching.

The anisotropic etching techniques described herein may be utilized in both DC current TMECE and through-mask Faradaic electronically modulated etching (TM-FEME), which is an AC current based method. The following examples will be described with respect to DC current TMECE for purposes of illustration only.

Figure 2:
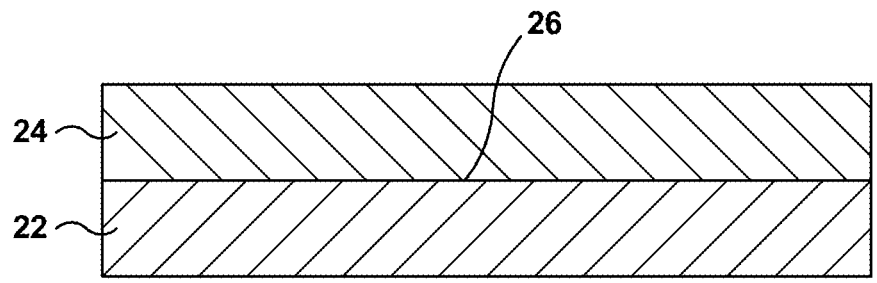
FIGS. 2-4 are conceptual diagrams illustrating an example article at various steps of the technique of FIG. 1.
Figure 3:
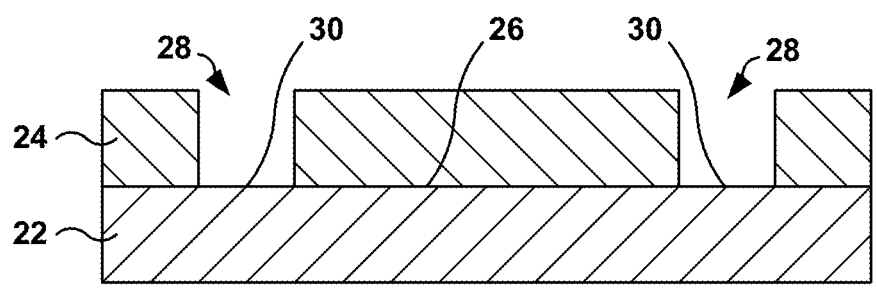
Figure 4:
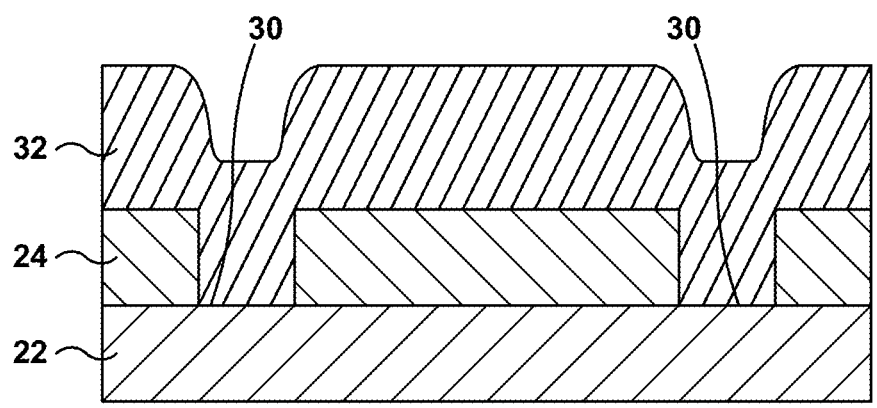

FIG. 1 is a flow diagram illustrating an example anisotropic electrochemical etching technique for etching features in a metallic substrate. The technique of FIG. 1 will be described with concurrent reference to the conceptual diagrams of FIGS. 2-4. Although FIGS. 2-4 illustrate an example of a simplified article that may be electrochemically etched using the technique of FIG. 1, other articles including other geometries or patterns of features may be electrochemically etched using the technique of FIG. 1. Additionally, although FIG. 1 illustrates one example technique, other example techniques according to this disclosure may include additional, optional, steps.

The technique illustrated in FIG. 1 includes depositing a photoresist layer 24 on a surface 26 of a metallic substrate 22 (10). Metallic substrate 22 may include an electrically conductive metal or alloy. In some examples, metallic substrate 22 may constitute part of a component of a gas turbine engine, such as a gas turbine engine combustor liner, a gas turbine engine vane, and a gas turbine engine blade, or the like. In some examples, metallic substrate 22 constitute part of a heat exchanger, a fuel cell, a microchannel chemical reactor, or the like. For example, metallic substrate 22 may include a high temperature alloy, such as a Ni-based superalloy, a Co-based superalloy, a Ti-based superalloy, or the like. An example superalloy includes a Ni-based superalloy available under the trade designation HAYNES® 230® Alloy from Haynes International, Inc., Kokomo, Ind. HAYNES® 230® Alloy includes about 57 weight percent (wt. %) Ni, about 5 wt. % Co, about 22 wt. % Cr, about 2 wt. % Mo, about 14 wt. % W, about 3 wt. % Fe, about 0.4 wt. % Si, about 0.5 wt. % Mn, about 0.10 wt. % C, about 0.3 wt. % Al, about 0.015 wt. % B, and about 0.02 wt. % La.

Photoresist layer 24 may include a positive photoresist (the portion of the photoresist layer 24 exposed to light becomes more soluble to the solvent used to develop photoresist layer 24) or a negative photoresist (the portion of the photoresist layer 24 exposed to light becomes less soluble to the solvent used to develop photoresist layer 24). In some examples, photoresist layer 24 may include an electrically insulative polymer, such as poly(methyl methacrylate) (PMMA), or the like. In some examples, photoresist layer 24 may be deposited on surface 26 as a solution or suspension in a solvent, then dried to remove the solvent. In some implementations, the solution or suspension may be spin coated onto surface 26 to facilitate formation of a uniform thickness of photoresist layer 24.

The technique of FIG. 1 also includes developing photoresist layer 24 to define a predetermined pattern using photoresist layer 24 (12). Developing photoresist layer 24 (12) may include exposing predetermined portions of photoresist layer 24 to light, which causes a chemical change in the portions of photoresist layer 24 exposed to the light. Depending on whether the photoresist layer 24 includes a positive photoresist or a negative photoresist, exposure to light may increase or decrease the solubility of the photoresist layer 24 to a solvent. In this way, photoresist layer 24 may be exposed to light in a predetermined spatial pattern to define a pattern of portions of photoresist layer 24 to be removed by immersion in the solvent.

Developing photoresist layer 24 (12) also may include washing or submerging photoresist layer 24 in the solvent to remove the predetermined portions of photoresist layer 24. For example, as illustrated in FIG. 3, portions 28 of photoresist layer 24 have been removed, exposing exposed surfaces 30 of metallic substrate 22. The exposed surface 30 of metallic substrate 22 will be etched in subsequent steps of the technique of FIG. 1, so the exposed surfaces 30 of metallic substrate 22 correspond to the pattern of features to be formed in metallic substrate 22. Because of this, the exposed surfaces 30 of metallic substrate 22, corresponding to the portions of photoresist layer 24 that were removed during development of photoresist layer 24, may be discrete (separate) geometrical features, such as circles, ellipses, squares, other polygons, or the like, or may form connected geometrical features, such as lines, grids, or the like, depending on the features to be formed in metallic substrate 22.

The technique of FIG. 1 also includes depositing an electrically conductive layer 32 (FIG. 4) over photoresist layer 24 and the exposed surfaces 30 of metallic substrate 22 (14). Electrically conductive layer 32 overlays photoresist layer 24 where the photoresist layer 24 is present, and contacts exposed surfaces 30 of metallic substrate 22. This results in an electrical connection being formed between electrically conductive layer 32 and metallic substrate 22.

In some examples, electrically conductive layer 32 may include an electrically conductive metal or alloy. For example, electrically conductive layer 32 may include gold, silver, copper, aluminum, nickel, or another conductive element, or an alloy including gold, silver, copper, aluminum, nickel, or another conductive element. In some examples, electrically conductive layer 32 may include an electrically conductive metal or alloy disposed in a binder. For example, electrically conductive layer 32 may include nickel in a binder, which may be applied as a paint. An example electrically conductive paint includes a paint including nickel flakes in an acrylic binder, available under the trade designation Super Shield™ from M.G. Chemicals®, Surrey, British Columbia.

In some examples, electrically conductive layer 32 may be deposited (14) from a solution or suspension, such as a paint. For example, electrically conductive layer 32 may be sprayed, brushed, spin coated, dip coated, or otherwise deposited from a solution or suspension, then the solution or suspension may be dried or cured to form electrically conductive layer 32. In other examples, electrically conductive layer 32 may be deposited (14) using a vapor phase deposition technique, such as sputtering, a chemical vapor deposition (CVD) technique, a physical vapor deposition (PVD) technique, directed vapor deposition (DVD), or the like.

In other examples, electrically conductive layer 32 may be deposited (14) using a multi-step process. For example, a first layer including an electrically conductive material may be deposited using electroless plating of a nickel alloy or a copper alloy. In some implementations, a first layer including a nickel alloy, such as a nickel-boron alloy or a nickel-phosphorus alloy may be deposited using electroless nickel plating. This may result in the first layer including the nickel alloy being deposited on the surface of photoresist layer 24 and exposed surfaces 30 of metallic substrate 22. Electroless plating may result in a first layer with a substantially uniform thickness on all coated surfaces.

Subsequently, a second layer including an electrically conductive material may be deposited on the first layer using electroplating. Because electroless plating coated the surface of photoresist layer 24 and exposed surfaces 30 of metallic substrate 22 with electrically conductive material, such as a nickel alloy, electroplating may be used to deposit material on the first layer. Forming the second layer using electroplating may increase the thickness of electrically conductive layer 32. Additionally, using electroless plating and electroplating may facilitate formation of an electrically conductive layer 32 with a substantially uniform thickness (e.g., a uniform or nearly uniform thickness; measured in the direction substantially normal to the surface 26 of substrate 22). Substantially uniform thicknesses of photoresist layer 24 and electrically conductive layer 32 may facilitate control of the depth of features formed in metallic substrate 22 using electrochemical etching.

Electrically conductive layer 32 may be deposited to a thickness that substantially shields (e.g., shields or nearly shields) the underlying metallic substrate 22 from the electrical field used during electrochemical etching, aside from the locations where electrically conductive layer 32 contacts exposed surfaces 30 of metallic substrate 22. This may result in the electrical field at the etch surfaces of metallic substrate 22 being directed more strongly in a direction normal to exposed surfaces 30 that parallel to exposed surfaces 30, which may facilitate anisotropic etching of metallic substrate 22. As used herein, anisotropic etching may refer to etching where the etch rate (measured as etch distance per unit time) in the direction normal to exposed surfaces 30 is greater than the etch rate in the direction parallel to exposed surfaces 30. Because the time is equal for lateral etching and vertical etching of a feature, one technique for determining the etch ratio is to determine the lateral etch extent and the vertical etch extent and compare the two. The lateral etch extent may be determined by measuring a maximum lateral etch extent for the feature (e.g., a diameter of the feature), subtracting the diameter of the photoresist opening, and dividing by two. This gives the lateral etch distance. The vertical etch distance is the maximum depth of the feature. By dividing the lateral etch distance by the vertical etch distance, a ratio of the lateral etch rate to the vertical etch rate is determined. For isotropic etching, the ratio of lateral etch rate to vertical etch rate is about 1 (e.g., greater than about 1). For anisotropic etching, the ratio of lateral etch rate to vertical etch rate is less than 1, such as less than about 0.75, or less than 0.6, about 0.5, or less than about 0.5.

In some examples, in addition to facilitating anisotropic etching of metallic substrate 22, electrically conductive layer 32 attaches to photoresist layer 24, and may strengthen and/or stiffen photoresist layer 24, particularly during times when portions of metallic substrate 22 are removed from under photoresist layer 24 during electrochemical etching.

Figure 5:
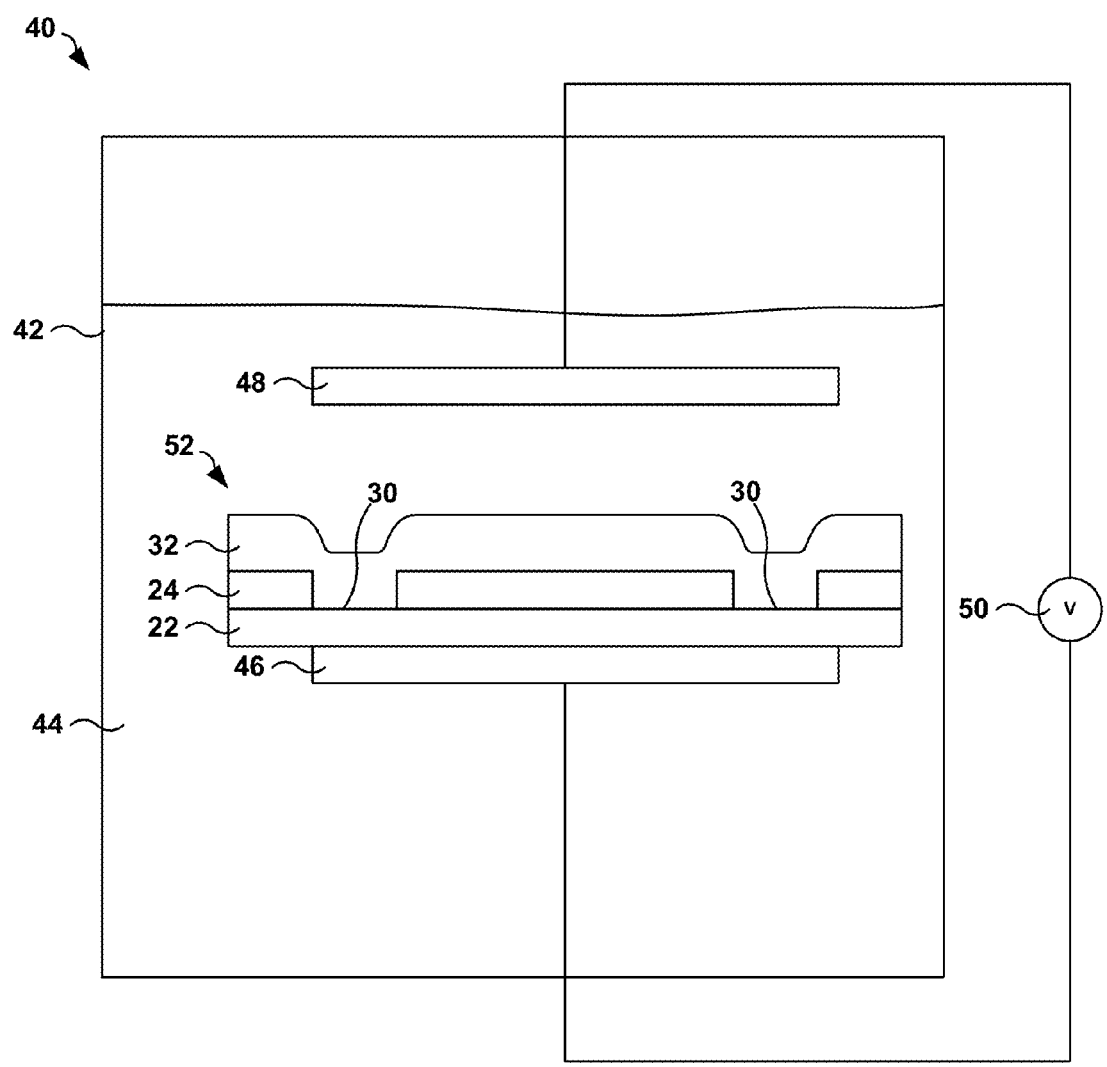
FIG. 5 is a conceptual diagram illustrating an example system for electrochemically etching a metallic substrate.

The technique of FIG. 1 also includes electrochemically etching features in metallic substrate 22 (16). FIG. 5 is a conceptual diagram illustrating an example system 40 for electrochemically etching a metallic substrate 22. The example system 40 illustrated in FIG. 5 includes a container 42 containing an electrolyte solution 44, in which an article 52 to be etched is submerged. Article 52 may be similar to or substantially the same as the article illustrated in and described with respect to FIG. 4, and may include a metallic substrate 22, a photoresist layer 22 on the surface of metallic substrate 22, and an electrically conductive layer 32 on photoresist layer 22. In some examples, although not illustrated in FIG. 5, photoresist layer 22 may substantially cover surfaces of metallic substrate 22 except the exposed surfaces 30 and the surface 54 in contact with anode 46, such that electrolyte solution 44 does not contact substrate 22 aside from locations at which metallic substrate 22 is being etched.

Metallic substrate 22 contacts and is electrically coupled to a first electrode 46. First electrode 46 may be an anode, and is submerged in electrolyte solution 44. First electrode 46 is electrically coupled to a voltage source 50, which is also electrically coupled to a cathode 48. Cathode 48 is also submerged in electrolyte solution 44.

Voltage source 50 applies a voltage difference between anode 46 and cathode 48, which generates an electrical field within electrolyte solution 44. As metallic substrate 22 is in contact with and electrically coupled anode 46, metallic substrate 22 acts as an anode, so the electrical field extends between cathode 48 and metallic substrate 22. Electrically conductive layer 32 acts as a shield from the electric field except at the locations at which electrically conductive layer 32 contacts metallic substrate 22. This results in the electrical field being shaped to have a greater magnitude in the direction substantially normal to exposed surfaces 30 than in the direction parallel to exposed surfaces 30 (at exposed surfaces 30 and within metallic substrate 22 during the etching process. This may lead to anisotropic etching of metallic substrate 22, in which the etching rate is greater in the direction normal to exposed surfaces 30 than in the direction parallel to exposed surfaces 30.

The etching depth may be controlled by the voltage applied between cathode 28 and anode 46 and by the time for which the voltage is applied (the etching time). As described above, because the deposition processes used to deposit photoresist layer 24 and electrically conductive layer 32 result in layers 24 and 32 having substantially uniform thicknesses, the etch depth for each feature may be substantially the same. In some examples, etching processes including a plurality of etching steps with different photoresist patterns may be used to form features with different depths. In some examples, features may extend through the thickness of metallic substrate 22 (e.g., through holes such as cooling holes). In other examples, features may extend partially through the thickness of metallic substrate 22 (e.g., depressions or channels).

Anisotropic electrochemical etching may facilitate economic formation of a plurality of features metallic substrate, due to the parallel formation of the plurality of features. In some examples, anisotropic electrochemical etching may facilitate high areal density of features compared to isotropic etching.

EXAMPLES

Comparative Example 1

Figure 6:
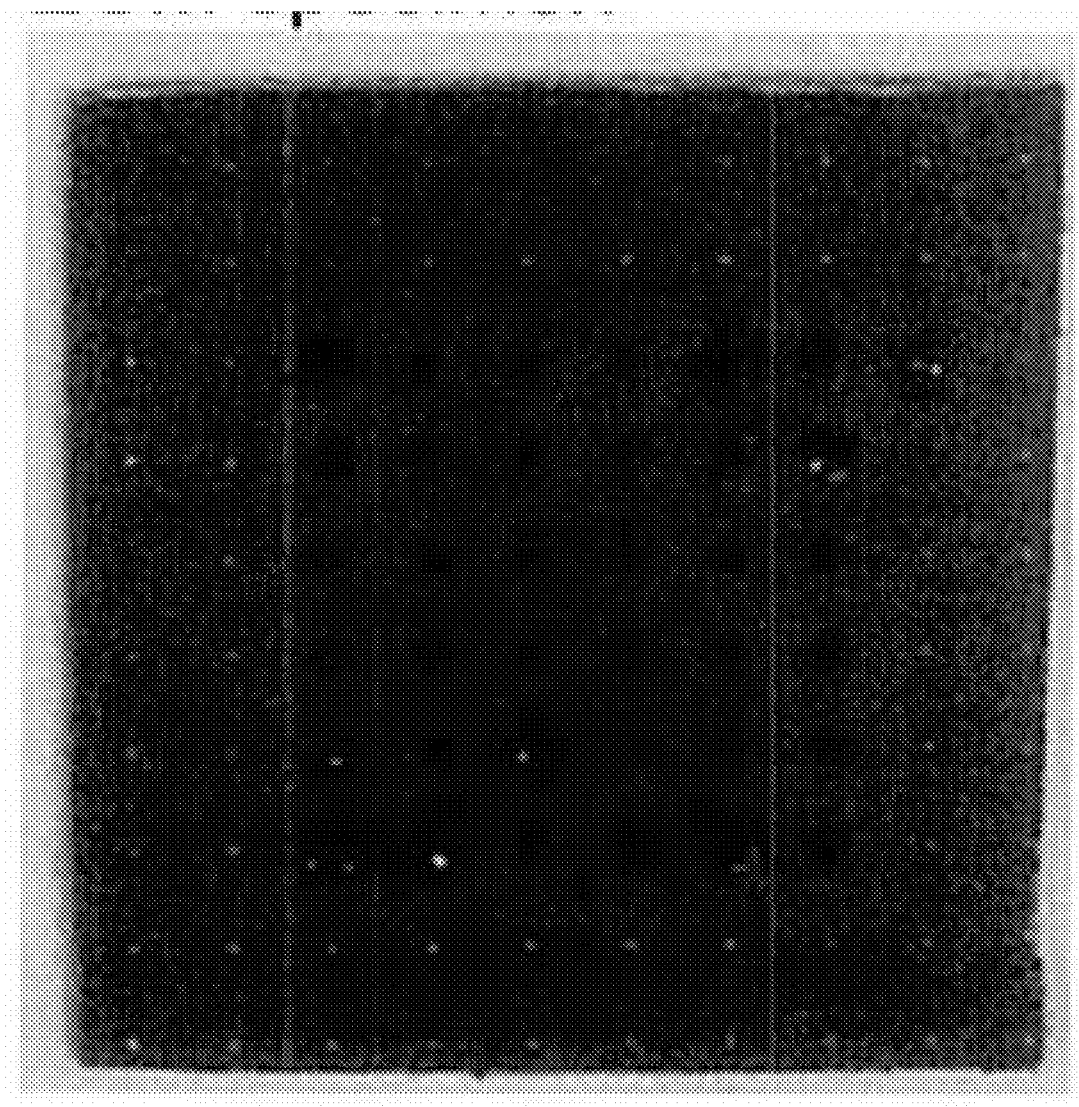
FIG. 6 is an image illustrating an example metallic substrate coated with a photoresist layer.

FIG. 6 is an image illustrating an example metallic substrate coated with a photoresist layer. The metallic substrate measured about 1 inch (about 2.54 cm) by about 1 inch (about 2.54 cm). The metallic substrate was etched using a base electrochemical etching process to form a plurality of features in the metallic substrate.

Example 1

Figure 7:
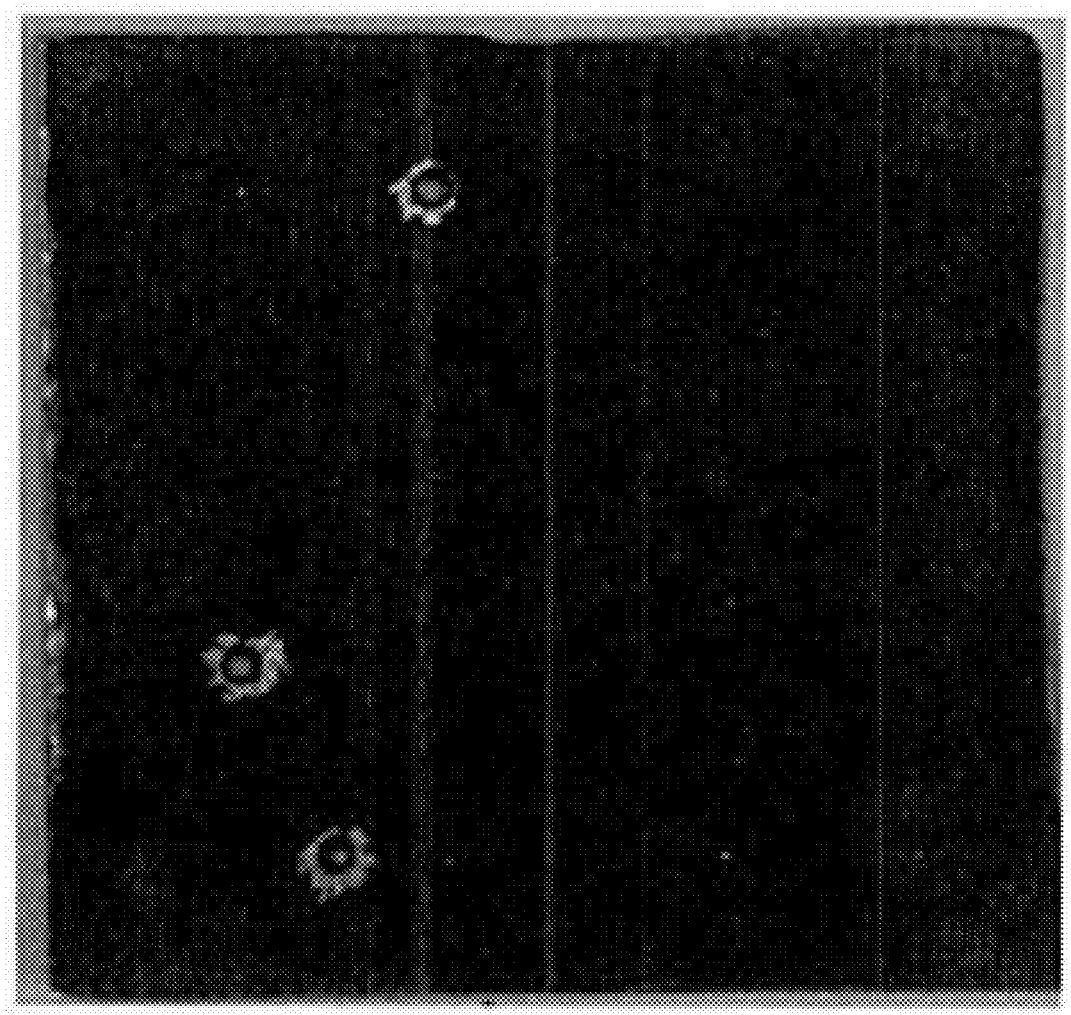
FIG. 7 is an image illustrating an example metallic substrate coated with a photoresist layer and an electrically conductive layer.

FIG. 7 is an image illustrating an example metallic substrate coated with a photoresist layer and an electrically conductive layer. The electrically conductive layer was applied to the surface of the photoresist layer after the photoresist layer was developed to form the predetermined pattern in the photoresist layer. The electrically conductive layer was deposited by spraying the sample with a paint including nickel flakes in an acrylic binder, available under the trade designation Super Shield™ from M.G. Chemicals®, Surrey, British Columbia. At locations where the developing of the photoresist layer exposed the underlying metallic substrate surface, the electrically conductive layer contacted the metallic substrate surface.

Figure 8:
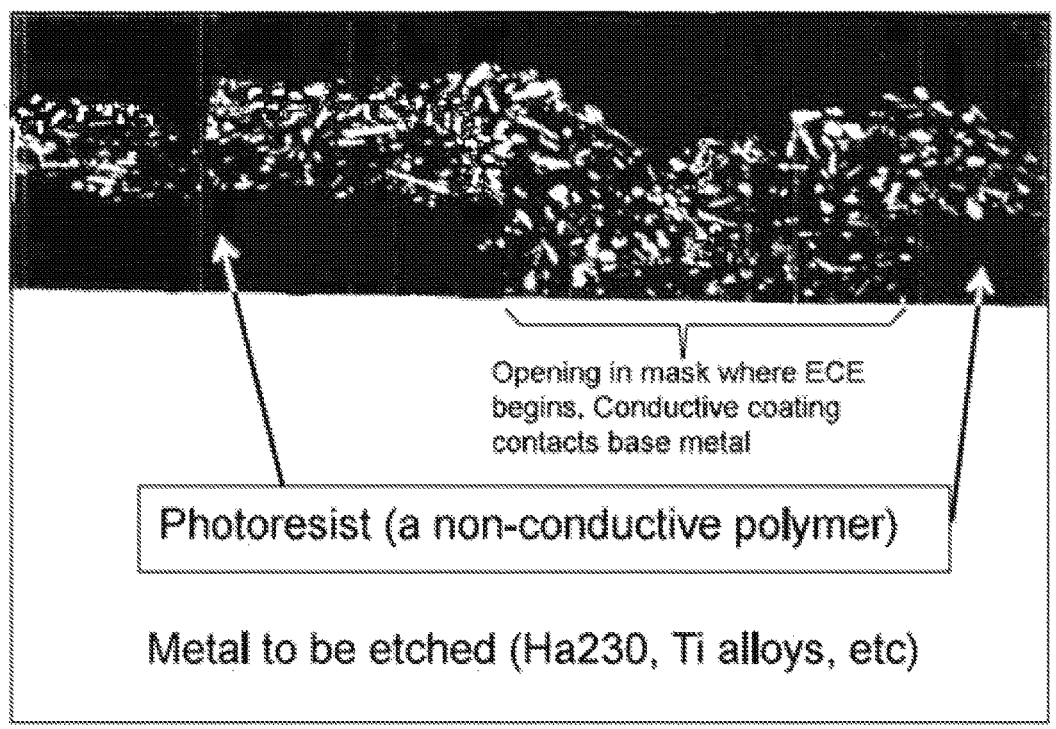
FIG. 8 is an image illustrating an example cross-sectional view of a metallic substrate coated with a photoresist layer and an electrically conductive layer.

FIG. 8 is an image illustrating an example cross-sectional view of a metallic substrate coated with a photoresist layer and an electrically conductive layer. The image of FIG. 8 is a cross section of the image of FIG. 7. As shown in FIG. 8, the electrically conductive layer is formed on the photoresist layer, and contacts the metallic substrate at locations where the photoresist was removed when developed.

Example 2

Figure 9:
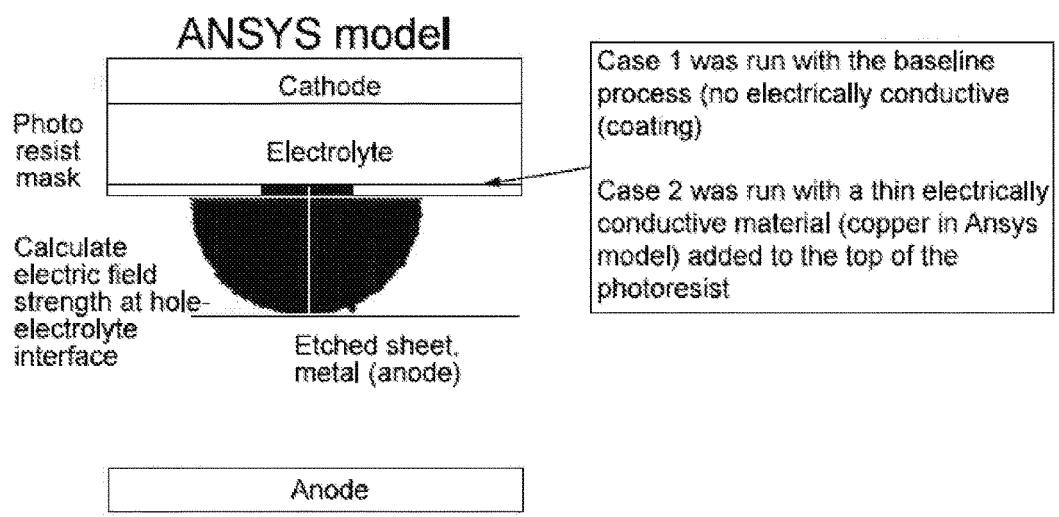
FIG. 9 is a conceptual diagram illustrating an example model for determining electric field during an electrochemical etching process.

FIG. 9 is a conceptual diagram illustrating an example model for determining electric field during an electrochemical etching process. The model included an anode contacting the metallic substrate to be etched, an etched cavity formed in the metallic substrate, a photoresist mask formed on the surface of the metallic substrate, an electrolyte, and a cathode contacting the electrolyte. In one model, only the photoresist mask was present over the metallic substrate. In a second model, a thin copper layer was formed on top of the photoresist.

Figure 10A:
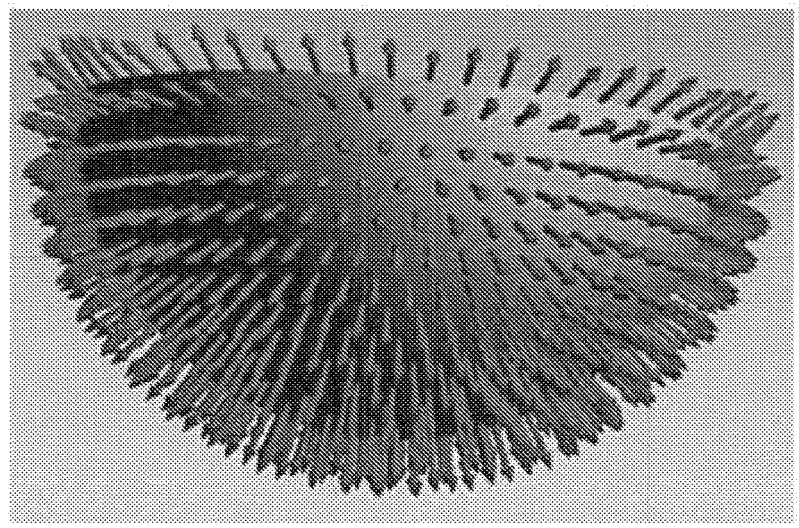
FIGS. 10A and 10B are conceptual diagrams illustrating example electric field vectors during electrochemical etching without an electrically conductive layer and with an electrically conductive layer, respectively.
Figure 10B:
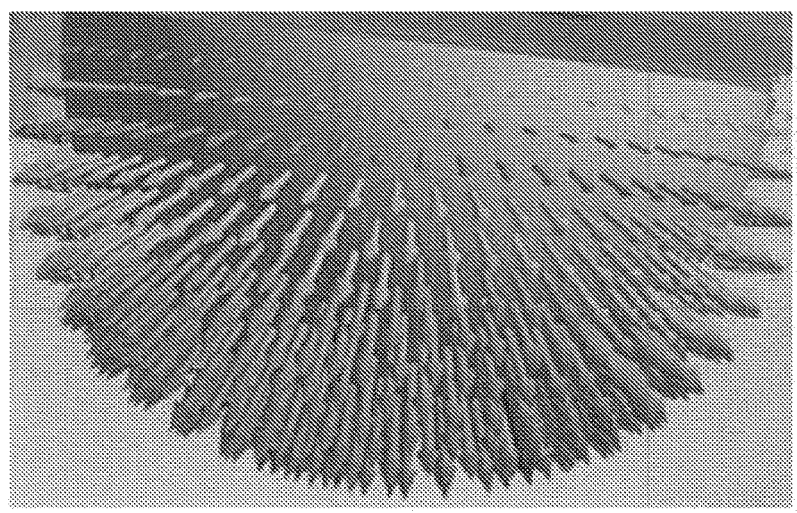

The electric field was modeled using Ansys software. FIGS. 10A and 10B are conceptual diagrams illustrating example electric field vectors during electrochemical etching without the electrically conductive copper layer and with the electrically conductive copper layer, respectively. As shown in FIG. 10A, the electric field on a partially etched surface of the metallic substrate are substantially uniform when only the photoresist layer is present on the surface of the metallic substrate. In contrast, when the electrically conductive copper layer is present on the surface of the photoresist layer, the magnitude of the electric field vectors is greater at the bottom of the partially etched surface. While not wishing to be bound by any theory, the bottom of the partially etched surface has a direct electrical line of sight to the cathode and are substantially normal to the direction of the electric field generated by the cathode. When the electrically conductive copper layer is present on the surface of the photoresist layer, the electrically conductive coating partially shields the side walls of the partially etched surface, which reduced the etching rate at these surfaces.

Comparative Example 2

Figure 11:
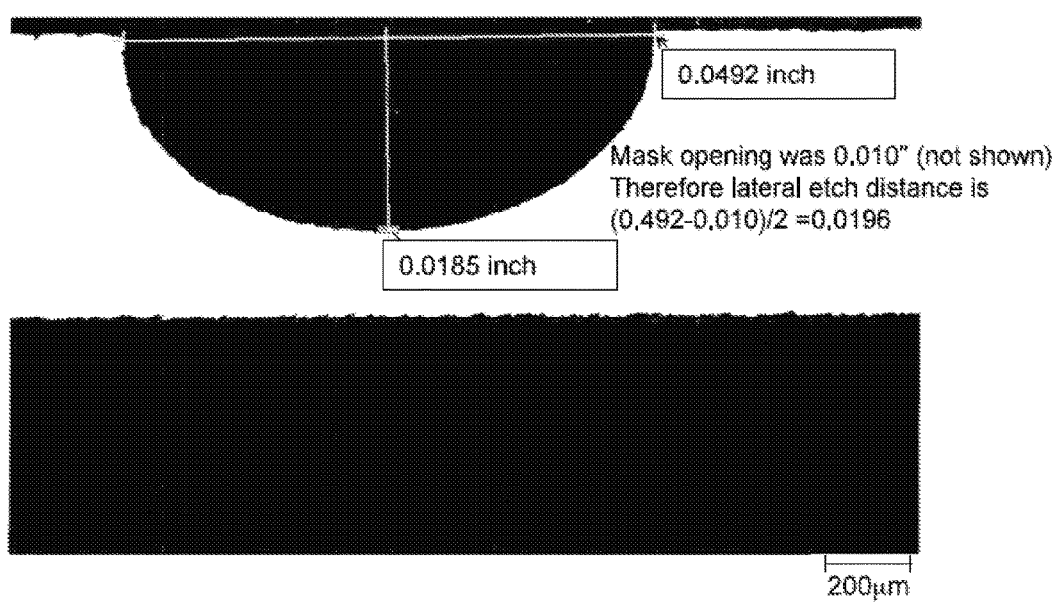
FIG. 11 is a micrograph illustrating a cross-sectional view of an example metallic substrate after isotropic electrochemical etching.

FIG. 11 is a micrograph illustrating a cross-sectional view of an example metallic substrate after isotropic electrochemical etching. As shown in FIG. 11, the diameter of the feature was about 0.0492 inch (about 1250 micrometers) and the depth was about 0.0185 inch (about 470 micrometers). Although not shown in FIG. 11, the diameter of the mask opening was about 0.010 inch (about 254 micrometers). The lateral etch distance was thus about 0.0492 inch (about 1250 micrometers)–0.010 inch (about 254 micrometers)=0.0392 inch (about 995.7 micrometers)/2=0.0196 inch (about 497.8 micrometers), which is 1.05 times the etch depth of about 0.0185 inch (about 470 micrometers). This demonstrates isotropic etching.

Example 3

Figure 12:
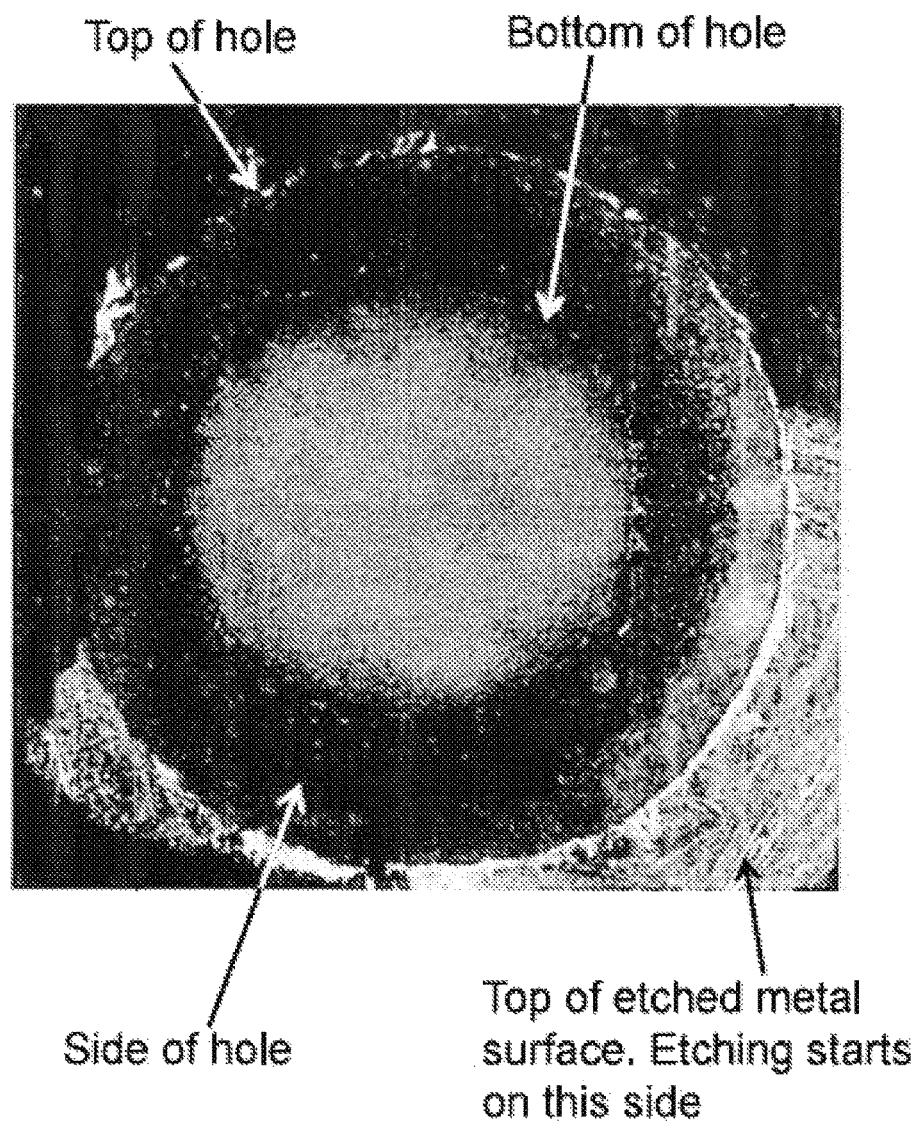
FIG. 12 is an image illustrating an example top view of a feature formed in a metallic substrate using anisotropic electrochemical etching.
Figure 13:
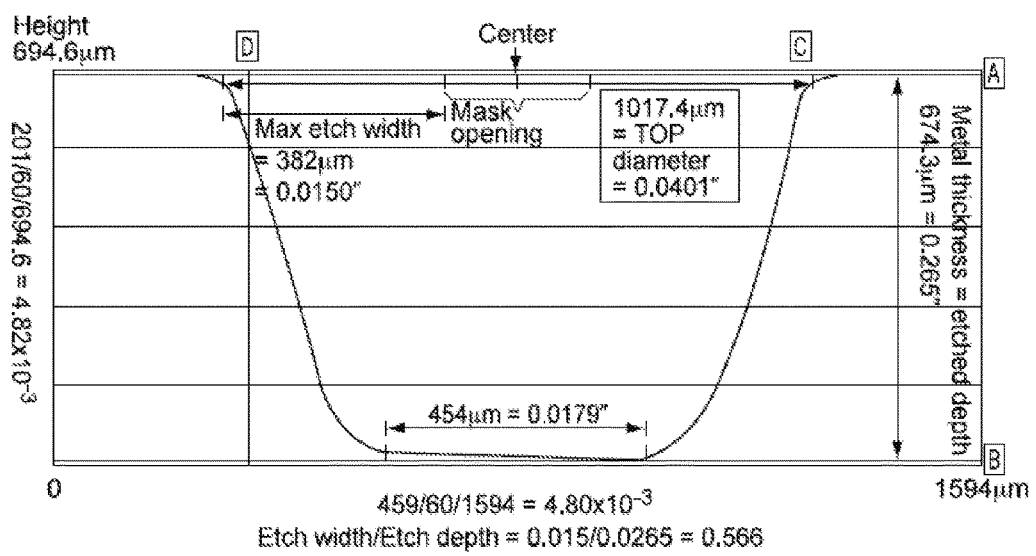
FIG. 13 is a diagram illustrating an example profile of the feature shown in FIG. 8.

FIG. 12 is an image illustrating an example top view of a feature formed in a metallic substrate using anisotropic electrochemical etching. FIG. 13 is a diagram illustrating an example profile of the feature shown in FIG. 12 measured at the centerline of the feature. The feature was etching using an electrically conductive layer formed from Super Shield™ on the photoresist layer. The measured profile shows that the maximum lateral etch distance at the top of the feature was about 0.015 inch (about 382 micrometers), based on a diameter of the hole of about 0.0401 inch (about 1017.4 micrometers) and mask opening diameter of about 0.010 inch (about 254 micrometers). The etch depth was about 0.0265 inch (about 674.3 micrometers), which was the depth of the metallic substrate. This resulted in an etch width to etch depth ratio of about 0.566, indicating anisotropic etching. The diameter of the bottom of the hole was about 0.0179 inch (about 454 micrometers).

Example 4

FIGS. 14A-14C are example images of features formed in metallic substrates using anisotropic electrochemical etching. The respective FIGS. also illustrate the ratio of the lateral etch distance to vertical etch distance for each of the features. The features in FIGS. 14A and 14B are blind holes, which do not extend through the thickness of the metallic substrate. The feature in FIG. 14C is a through hole, which extends through the depth of the metallic substrate. The depth of the features was controlled by controlling the etch time; longer etch times produce deeper features, other factors being equal. For the feature illustrated in FIG. 14A, the ratio of the lateral etch distance to vertical etch distance was about 0.57. For the feature illustrated in FIG. 14B, the ratio of the lateral etch distance to vertical etch distance was about 0.59. For the feature illustrated in FIG. 14C, the ratio of the lateral etch distance to vertical etch distance was about 0.46.

Comparative Example 3 and Example 5

Figure 15A:
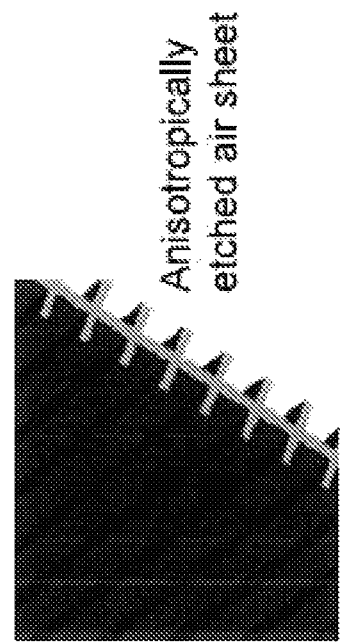
FIGS. 15A and 15B are conceptual images illustrating microchannels formed in metallic substrates using isotropic electrochemical etching and anisotropic electrochemical etching, respectively.
Figure 15B:
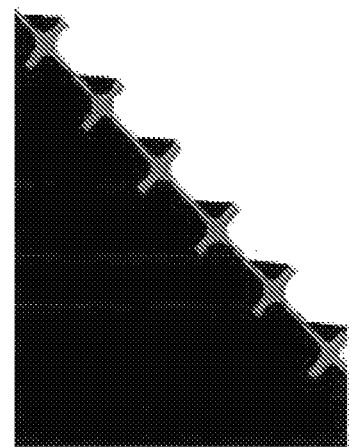

FIGS. 15A and 15B are conceptual images illustrating microchannels formed in metallic substrates using isotropic electrochemical etching and anisotropic electrochemical etching, respectively. As shown in FIG. 15B compared to FIG. 15A, anisotropic electrochemical etching may allow higher areal density of features for a similar feature depth.

Various examples have been described. These and other examples are within the scope of the following claims.

The invention claimed is:

1. A method comprising:
   forming a photoresist layer on a surface of a metallic substrate;
   developing the photoresist layer to define a pattern exposing a portion of the surface of the metallic substrate;
   forming an electrically conductive layer on a surface of the photoresist layer and the exposed portions of the surface of the metallic substrate, wherein the electrically conductive layer contacts the exposed portions of the surface of the metallic substrate; and
   submerging the substrate, the photoresist layer, and the electrically conductive layer in an electrolyte solution; and
   applying a voltage between a cathode and an anode submerged in the electrolyte solution to anisotropically etch the metallic substrate where the electrically conductive layer contacts the exposed portions of the surface of the metallic substrate to form at least one feature in the metallic substrate.

2. The method of claim 1, wherein forming the electrically conductive layer on the surface of the photoresist layer and the exposed portions of the surface of the metallic substrate comprises depositing the electrically conductive layer using a vapor deposition process.

3. The method of claim 2, wherein the vapor deposition process comprises at least one of sputtering, chemical vapor deposition, physical vapor deposition, and directed vapor deposition.

4. The method of claim 1, wherein forming the electrically conductive layer on the surface of the photoresist layer and the exposed portions of the surface of the metallic substrate comprises depositing the electrically conductive layer by at least one of painting, spraying, dip coating, and spin coating.

5. The method of claim 1, wherein forming the electrically conductive layer on the surface of the photoresist layer and the exposed portions of the surface of the metallic substrate comprises depositing the electrically conductive layer by:
   forming a first layer comprising an electrically conductive metal or alloy using electroless plating; and
   forming a second layer comprising an electrically conductive metal or alloy on the first layer using electroplating.

6. The method of claim 5, wherein the electrically conductive metal or alloy comprises nickel or a nickel alloy.

7. The method of claim 1, wherein the electrically conductive layer comprises a substantially uniform thickness measured in a direction substantially normal to the surface of the metallic substrate.

8. The method of claim 1, wherein the depth of the at least one feature is determined at least in part by the etching time.

9. The method of claim 8, wherein the at least one feature comprises at least one of a through hole, a blind hole, and a channel.

10. The method of claim 1, wherein a ratio of a maximum lateral etch distance of the at least one feature to a maximum vertical etch distance of the at least one feature is less than 1.0.

11. The method of claim 10, wherein the ratio of the maximum lateral etch distance of the at least one feature to the maximum vertical etch distance of the at least one feature is less than about 0.6.

* * * * *